(12) United States Patent
Lim et al.

(10) Patent No.: US 10,163,777 B2
(45) Date of Patent: Dec. 25, 2018

(54) INTERCONNECTS FOR SEMICONDUCTOR PACKAGES

(71) Applicant: INTEL CORPORATION, Santa Clara, CA (US)

(72) Inventors: Seok Ling Lim, Kulim (MY); Eng Huat Goh, Ayer Itam (MY); Hoay Tien Teoh, Paya Terubong (MY); Jenny Shio Yin Ong, Bayan Lepas (MY); Jia Yan Go, Kulim (MY); Jiun Hann Sir, Gelugor (MY); Min Suet Lim, Bayan Lapas (MY)

(73) Assignee: INTEL CORPORATION, Santa Clara ( * ) Notice: Subject to any disclaimer, the term of this patent is extended or adjusted under 35 U.S.C. 154(b) by 0 days.

(21) Appl. No.: 15/476,905

(22) Filed: Mar. 31, 2017

(65) Prior Publication Data

US 2018/0286804 A1    Oct. 4, 2018

(51) Int. Cl.
*H01L 23/522* (2006.01)
*H01L 23/528* (2006.01)
*H01L 23/043* (2006.01)

(52) U.S. Cl.
CPC ...... *H01L 23/5223* (2013.01); *H01L 23/5222* (2013.01); *H01L 23/5286* (2013.01); *H01L 23/043* (2013.01); *H01L 2225/06548* (2013.01); *H01L 2225/1047* (2013.01)

(58) Field of Classification Search
CPC ............. H01L 23/5223; H01L 23/5222; H01L 23/5286; H01L 23/043; H01L 23/3128; H01L 23/3735; H01L 23/49527; H01L 23/49534; H01L 2225/1047; H01L 2225/06548
See application file for complete search history.

(56) References Cited

U.S. PATENT DOCUMENTS

| | | | | |
|---|---|---|---|---|
| 2005/0218502 | A1* | 10/2005 | Sunohara | H01L 23/49822 257/700 |
| 2006/0138591 | A1* | 6/2006 | Amey, Jr. | H01L 23/49822 257/532 |
| 2009/0237900 | A1* | 9/2009 | Origuchi | H01L 23/49838 361/763 |
| 2010/0084738 | A1* | 4/2010 | Masuda | H01G 4/01 257/532 |

* cited by examiner

*Primary Examiner* — Cheung Lee
*Assistant Examiner* — Stephen C Smith

(57) ABSTRACT

Interconnects for semiconductor packages are described. An apparatus may comprise a decoupling capacitor on a logic board, and a conductive interconnect element on the logic board, the conductive interconnect element to connect the decoupling capacitor on the logic board to a power conductor comprising a power pad of a semiconductor package, the conductive interconnect element at a different layer than a ground-potential layer of the logic board. Other embodiments are described and claimed.

14 Claims, 13 Drawing Sheets

3x3+

L1: power connection (for edge capacitor)

L2: Vss

L3: IO

L4: Vss

L5: IO

L6: Vss/Vcc

L7: (variable)

L8: (variable)

L9: (variable)

L10: (variable)

L1: power connection (for edge capacitor)

L2: IO

L3: Vss

L4: IO

L5: Vss

L6: (variable)

L7: (variable)

L8: (variable)

L9: (variable)

L10: (variable)

FIG. 4B

INTERCONNECTS FOR SEMICONDUCTOR PACKAGES

TECHNICAL FIELD

Embodiments described herein generally relate to microelectronics. More particularly, embodiments described herein relate to interconnects for a decoupling capacitor on a logic board.

BACKGROUND

A logic board system may typically include a semiconductor package mounted on a logic board. Decoupling solutions for a logic board system are critical to ensure efficiency and power integrity of the system. In this regard, given the modern trends requiring ever smaller package form factor, a decoupling solution becomes limited at the package level. An option to address this limitation is using capacitors on a logic board system. However, implementing capacitors presents many design considerations, such as tradeoffs needed for the board routing and layer count impact, among others.

BRIEF DESCRIPTION OF THE DRAWINGS

FIGS. 4A, 4B illustrate example layer assignments for the layer stack-up configurations of FIGS. 3A, 3B, respectively.

DETAILED DESCRIPTION

Figure 1:
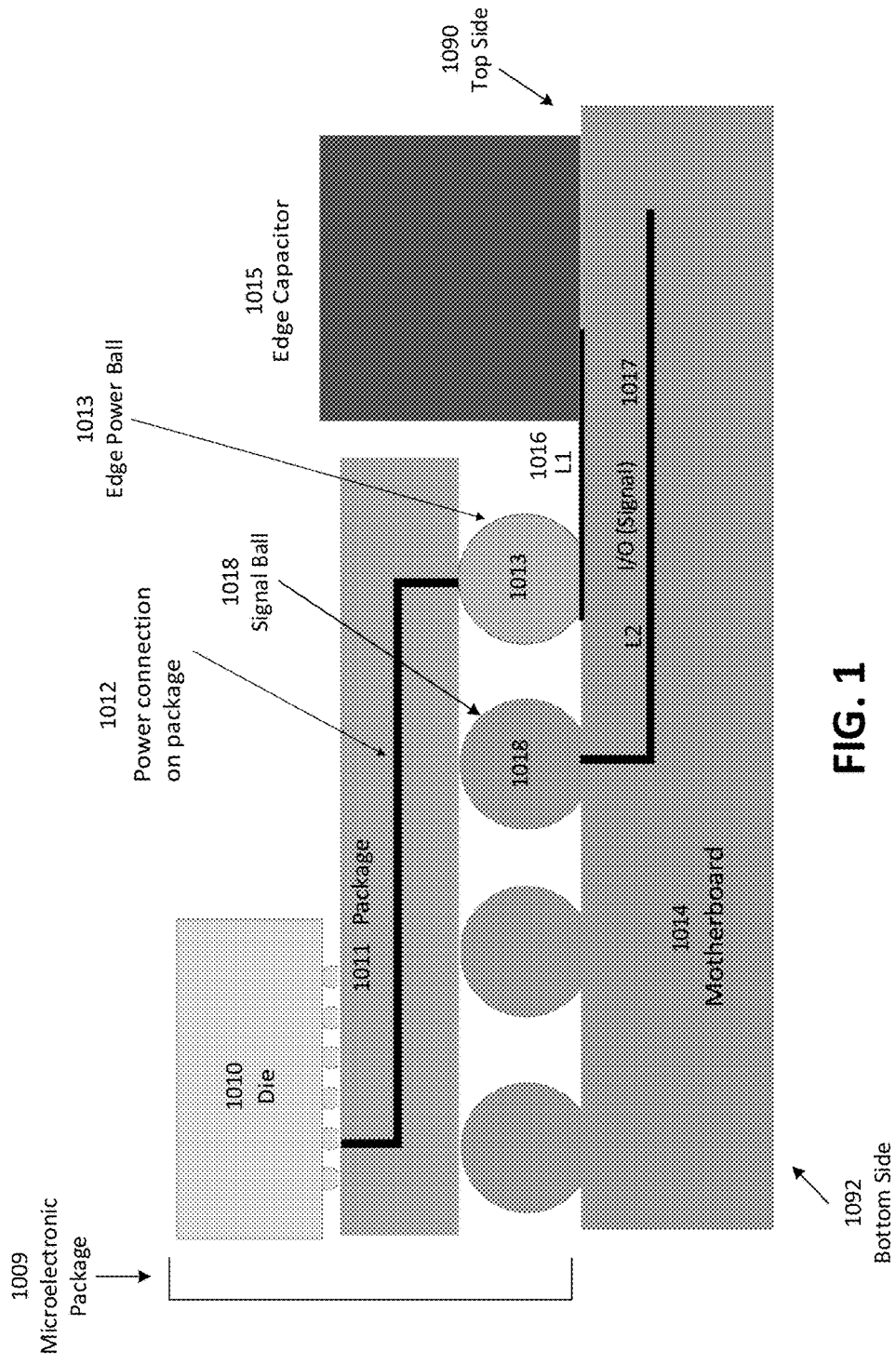
FIG. 1 illustrates an example placement of a surface-mounted decoupling edge capacitor on a single-sided motherboard.

Embodiments generally relate to microelectronics and semiconductor packaging. More particularly, embodiments relate to a logic board system comprising a decoupling capacitor and semiconductor package implemented on a logic board. For instance, some embodiments relate to a novel interconnect for a logic board system, where the novel interconnect forms an improved interconnection between one or more decoupling capacitors and a semiconductor package, for example. In general, a decoupling capacitor is a capacitor used to decouple one part of an electrical network (circuit) from another. A decoupling capacitor may also be referred to sometimes as an "edge capacitor," an "edge-mounted decoupling capacitor," and so forth. A logic board is some form of substrate material arranged to hold and allow communication between electronic components of a system, such as one or more semiconductor packages. A logic board may also be referred to sometimes as a "motherboard" or a "mainboard" or "system board" or "baseboard" or "planar board" or "printed circuit board (PCB)" and so forth. Embodiments are not limited in this context.

As semiconductor packages increase in density, interface connection density, and clock speed, certain requirements for electrically decoupling the semiconductor packages become more stringent. Examples of semiconductor packages may include, without limitation, surface-mount packaging such as a ball grid array (BGA) package, a chip array BGA (CABGA), a flip-chip ball grid array (FCBGA), and a host of other semiconductor packages. As such, it may be advantageous to place decoupling capacitors as close to pads (e.g., BGA pads) as possible. In addition, although a logic board may have electronic components mounted on both sides (e.g., top and bottom), a single-sided design conserves space as device form-factors become smaller over time (e.g., ultra-thin devices).

Although decoupling capacitors generally provide a short loop-induction path for single-sided motherboard design, however, conventional decoupling capacitor configurations may present some negative effects, such as loss of signal integrity. In addition, conventional single-sided designs may suffer from power deliver and signal integrity quality issues.

To solve these and other problems, embodiments may provide a conductive interconnect formed on a single side of a logic board to interconnect various electronic components mounted on the logic board. For instance, a conductive interconnect may be disposed, mounted, positioned, printed or otherwise placed on a solder resist layer of a logic board (e.g., a motherboard) to interconnect a decoupling capacitor to a power conductor of a semiconductor package, such as a power ball of a ball grid array (BGA) package. In one embodiment, for example, a conductive interconnect element is provided as a power lead in a layer above a solder resist layer of a motherboard to connect a decoupling capacitor and a semiconductor package. The conductive interconnect element is connected to an edge power ball of the microelectronic package and to a power lead of the decoupling capacitor. A ground-potential layer is provided below the solder resist layer of the motherboard, and a signal layer is provided below the ground-potential layer of the motherboard. Because the conductive interconnect element provided as a power lead is above the solder resist layer of the motherboard, signals routed through the signal layer solely reference the ground-potential layer of the motherboard. Alternatively, a Z profile lead may be used to connect a microelectronic package and a decoupling capacitor in replacement of a conductive interconnect. In this way, embodiments may improve power integrity of the overall system and signal integrity of signals routed through a signal layer of a motherboard. Embodiments may also free up a surface layer (L1) of the logic board for use by other electronic components, interconnects and/or associated functions, such as operating as a Vss layer, for example.

Various embodiments may comprise one or more elements. An element may comprise any structure arranged to perform certain operations. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

FIG. 1 depicts a system 100 that illustrates an example placement of a surface-mounted decoupling capacitor on a single-sided motherboard. As shown in FIG. 1, an edge capacitor 1015 is provided or disposed on a top side 1090 of a motherboard 1014. The edge capacitor 1015 is connected to a first portion of a surface level layer 1016. The surface level layer 1016 may also be referred to herein as "Level One (L1)." The motherboard 1014 may include a second level layer, which in this case is a signal layer 1017. The signal layer 1017, may be used for input/output (I/O) operations, for example. The signal layer 1017 may also be referred to herein as "Level Two (L2)."

As shown in FIG. 1, the surface level layer 1016 is positioned above the signal layer 1017 relative to the bottom side 1092 of the motherboard 1014. In other words, a first plane formed along the bottom side 1092 is a bottom of a vertical stack. Above the first plane is a second plane formed along the signal layer 1017. Above the second plane is a third plane formed along the surface layer 1016. It may be appreciated that in formation of a semiconductor package, logic board, or interconnects, additional levels and/or layers may be disposed above, below or between the various levels and/or layers described herein. Embodiments are not limited in this context.

Positioned above the motherboard 1014 of FIG. 1 is a microelectronic package 1009. In one embodiment, for example, the microelectronic package 1009 may comprise or be implemented as a ball grid array (BGA) package. Other types of packages may be implemented as well. The BGA package may include, for example, a die 1010, a package 1011 having an internal power connection 1012, and at least one signal ball 1018 and at least one edge power ball 1013 on the bottom of the package 1011. The internal power connection 1012 connects the die 1010 to the edge power ball 1013, which is in turn connected to the L1 surface level layer 1016. The signal ball 1018 is connected to the L2 signal layer 1017.

Figure 2:
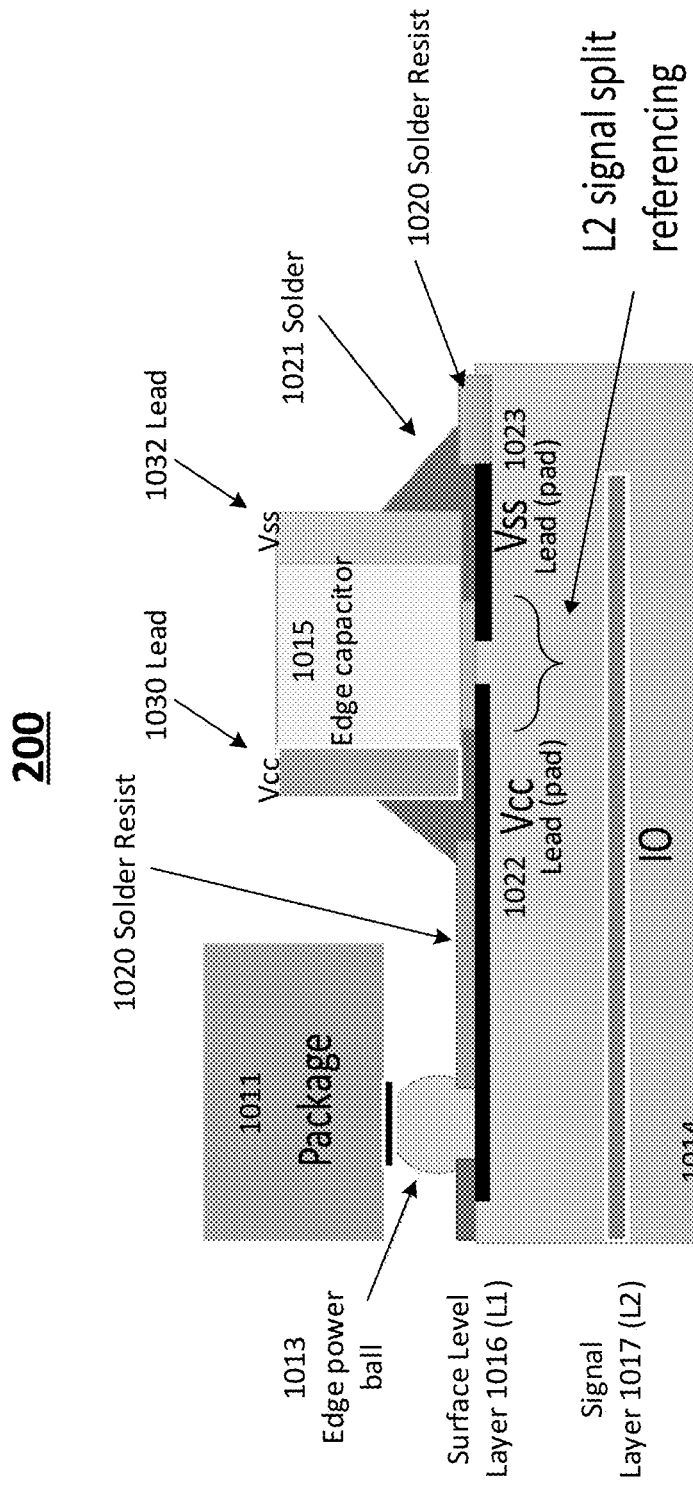
FIG. 2 illustrates an example configuration of a motherboard exhibiting a "split power referencing" for the signal layer.

FIG. 2 depicts a system 200 which comprises a more detailed example of system 100. More particularly, system 200 illustrates two built-up layers, comprising L1 surface level layer 1016 and L2 signal layer 1017, of the motherboard 1014.

As shown in FIG. 2, the L1 surface level layer 1016 is positioned below a solder resist 1020. The solder resist 1020 may include a first power (Vcc) lead 1022 and a second power (Vss) lead 1023. It is worthy to note that the term "lead" may also be interchangeably referred to, in some embodiments, as a "plane" or "pad." The first power (Vcc) lead 1022 may correspond to a positive power potential, and the second power (Vss) lead 1023 may correspond to a negative power potential or a ground potential. Examples are not limited in this context.

A first power (Vcc) lead 1030 and a second power (Vss) lead 1032 of the edge capacitor 1015 are connected via solder 1021 to the first power (Vcc) lead 1022 and the second power (Vss) lead 1023 of the L1 surface level layer 1016, respectively. The first power (Vcc) lead 1022 is in turn connected to the edge power ball 1013. As shown in FIG. 2, the L2 signal layer 1017 references both the first power (Vcc) lead 1022 and the second power (Vss) lead 1023. This arrangement is sometimes referred to as "split power referencing," and it has a significant affect for high-speed signaling, such as signaling using a universal serial bus (USB) Type C standard, for example.

Among the reasons why "split power referencing" is significant, noise coupling and impact on the return path represent two examples. The issue of noise coupling may be significant because different voltages are referenced, which may cause different noise coupling to signals on the same interface, e.g., the L2 signal layer 1017. In the case of a significant noise coupling, such as from the first power (Vcc) lead 1022, the signal quality may be substantially reduced. The issue of impact on return path may be significant because when signals transition from the power plane to the ground-potential plane, a gap between the power and ground-potential planes must be crossed, which results in diversion of the return current to go around the gap. This loss of the return path creates a large loop inductance, which in turn changes the characteristic impedance of the trace (e.g., in the L2 signal layer 1017) and causes deterioration of the signal quality.

Figures 3A, 3B:
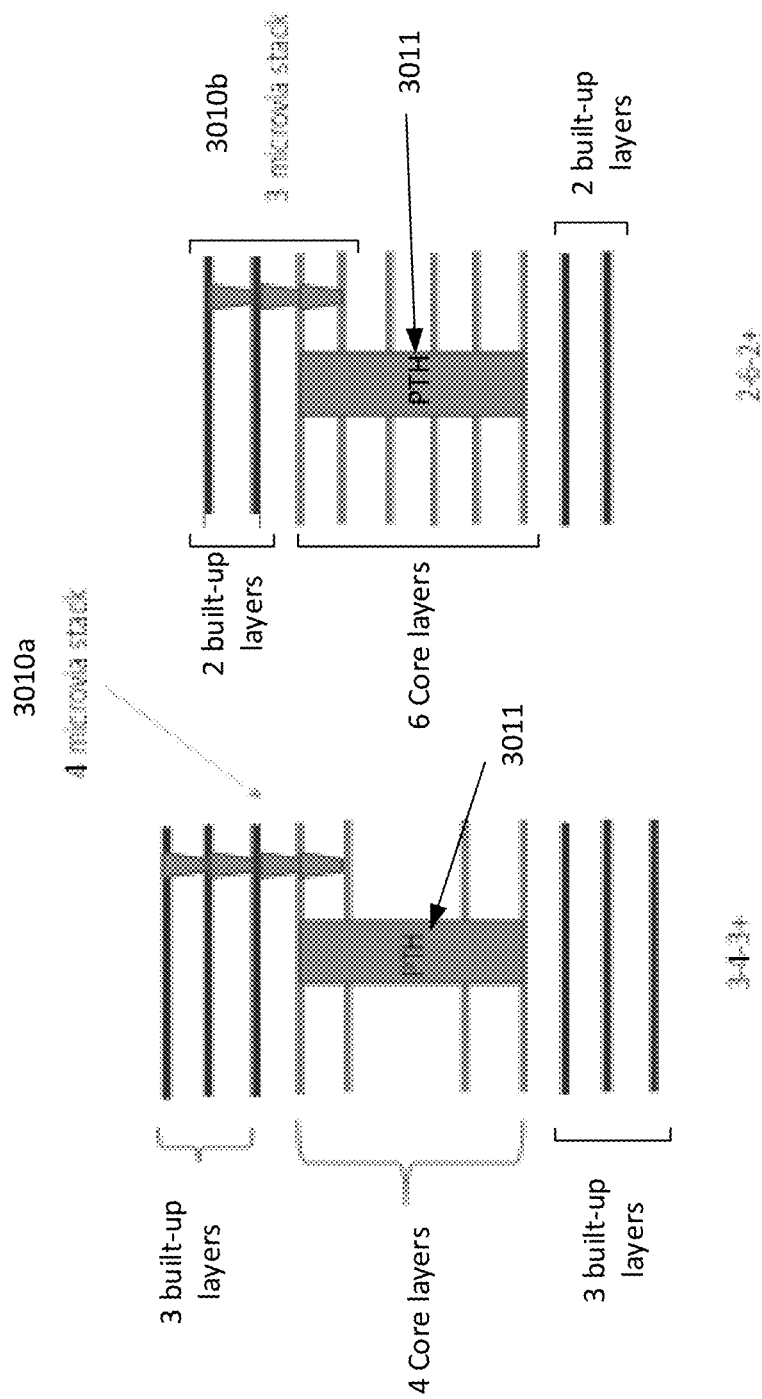
FIGS. 3A, 3B illustrate example layer stack-up configurations for a motherboard.

FIG. 3A illustrates an overall configuration for a 3-4-3+ layers stack-up, which configuration includes 3 built-up layers at each of the top and bottom of the motherboard (hence "3×3+"), with additional 4 core layers in the middle of the motherboard. As shown in FIG. 3A, the top three built-up layers and the top two core layers are connected by a four micro-via stack 3010a, and the four core layers in the middle may be connected by a plated through hole (PTH) 3011.

FIG. 3B illustrates an example of a "2×2+" layers stack-up configuration for a motherboard. The example configuration depicted in FIG. 3B is a 2-6-2+ layers stack-up, having 2 built-up layers at each of a top and bottom of the motherboard (hence "2×2+"), with additional 6 core layers in the middle of the motherboard. As shown in FIG. 3B, the top two built-up layers and the top two core layers may be connected by a three micro-via stack 3010b, and the six core layers in the middle may be connected by a plated through hole (PTH) 3011. As discussed previously with reference to FIG. 2, the input/output (I/O) L2 signal layer 1017 experiences split power referencing.

FIG. 4A illustrates exemplary layer assignments for a 3×3+ (e.g., 3-4-3+) layers stack-up as shown in FIG. 3A. As shown in FIG. 4A, L1 may be assigned as a power connection for an edge capacitor, L2 may be assigned Vss, L3 may be assigned for I/O, L4 may be assigned Vss, L5 may be assigned for I/O, L6 may be assigned Vss/Vcc, and L7-L10 may be variably assigned as needed for a given implementation.

FIG. 4B illustrates exemplary layer assignments for a 2×2+ (e.g., 2-6-2+) layers stack-up configuration as shown in FIG. 3B. As shown in FIG. 4B, L1 may be assigned as a power connection for an edge capacitor, L2 may be assigned for I/O, L3 may be assigned Vss, L4 may be assigned for I/O, L5 may be assigned Vss, and L6-L10 may be variably assigned as needed for a given implementation.

One approach for addressing the split power referencing issue is to use a "3×3+" layers stack-up arrangement or configuration for a motherboard, which configuration includes a Vss layer (L2 layer) sandwiched between the power connection layer (L1 layer) and the IO signal layer (L3 layer). This is shown in FIG. 4A, which depicts example layer assignments for a 3-4-3+ layers stack-up configuration. Because the configuration shown in FIGS. 3A, 4A requires 3 built-up layers at each of the top and bottom of the motherboard and 4 micro-vias to reach the second layer of the core layers, the cost of the motherboard (PCB) is increased by approximately 25-30% in comparison to the "2×2+" layers stack-up configuration shown in FIGS. 3B, 4B, which "2×2+" configuration requires one fewer built-up layer at each of the top and bottom of the motherboard and one fewer micro-via.

Various embodiments provide solutions which improve power integrity of the overall system and signal integrity of signals routed through a signal layer of the motherboard, while avoiding the costly "3×3+" layers stack-up configuration as previously discussed. Such arrangements avoid the use of expensive motherboard for a decoupling solution and signal integrity performance by effectively connecting the decoupling capacitor connection to the motherboard.

In one embodiment, for example, a conductive interconnect is formed on top of a PCB, such as on a solder resist layer of a motherboard, for example. The conductive interconnect provides an interconnection between the edge capacitor and at least one power conductor of a semiconductor package, such as a power conductor configured as a power ball of a ball grid array (BGA) package, for example. Since the solder resist layer may be provided over the surface layer of the motherboard, by providing the conductive interconnect on top of the solder resist layer of the motherboard, the surface layer of the motherboard may be allocated entirely to a single power plane, e.g., a Vss layer representing a ground-potential layer. In turn, a signal layer of the motherboard provided below the ground-potential layer solely references the ground-potential layer, thereby avoiding a split power referencing for the signal layer, for example. This in turn improves power integrity of the overall system and the signal integrity of signals routed through the signal layer below the ground-potential layer.

Figure 5A:
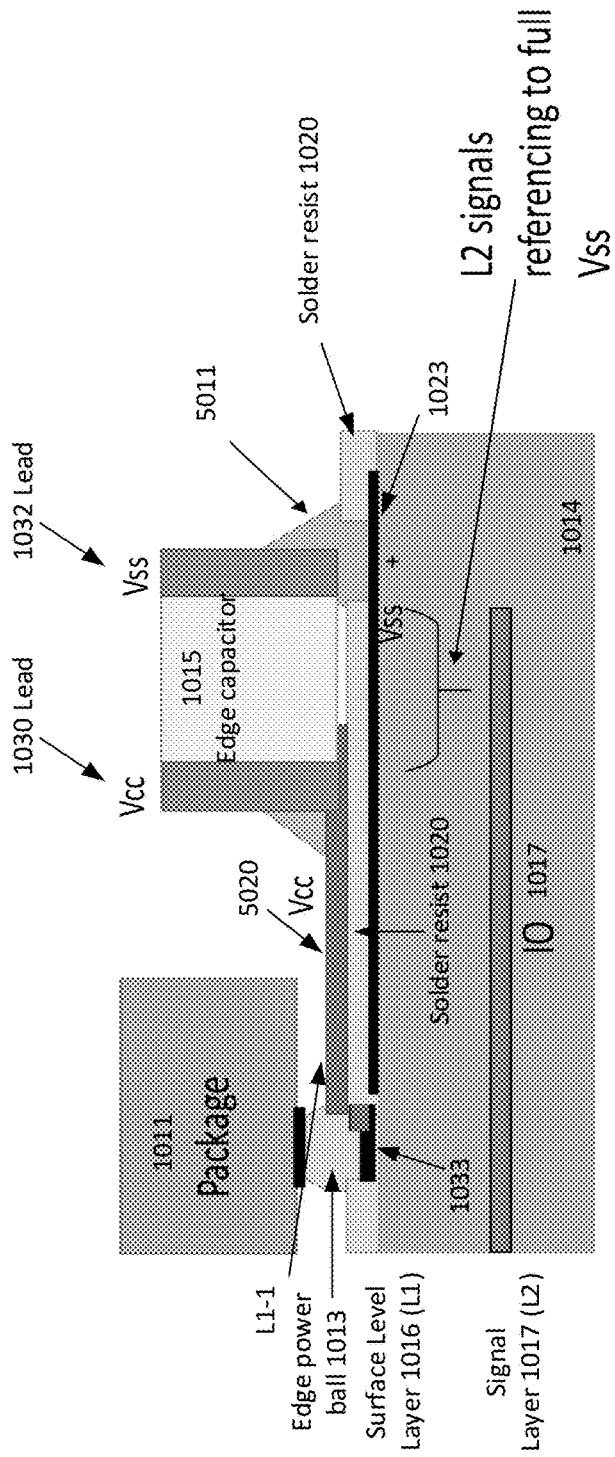
FIG. 5A illustrates an example configuration of a motherboard, to which an edge capacitor and a package are connected according to a first example embodiment.

FIG. 5A illustrates a system 500 having a layer sequence of a motherboard 1014, to which an edge capacitor 1015 and a package 1011 are connected according to an example embodiment. In FIG. 5A, the L1 layer below the solder resist 1020 includes a Vss lead 1023. The Vss lead 1023 may correspond to a ground potential in this example. Alternatively, the Vss lead 1023 may correspond to a negative power potential. Examples are not limited in this context.

Above the solder resist 1020, a conductive interconnect element 5020 is provided as a power (Vcc) lead in a layer L1-1, which power (Vcc) lead may represent positive power potential, for example. A first power (Vcc) lead 1030 and a second power (Vss) lead 1032 of the edge capacitor 1015 are connected (e.g., via a conductive material 5011 and a solder connection using a reflow soldering) to the conductive interconnect element 5020 provided as a power (Vcc) lead in the L1-1 layer and the Vss lead 1023 in the L1 layer, respectively. The conductive interconnect element 5020 provided as a power (Vcc) lead in the L1-1 layer is in turn connected to the edge power ball 1013 and the edge power ball pad 1033. As shown in FIG. 5, since the conductive interconnect element 5020 provided as a power (Vcc) lead in the layer L1-1 is above the solder resist 1020, signals routed through the L2 signal layer 1017 solely reference the Vss lead 1023 in the L1 layer, thereby avoiding the "split power referencing" and associated negative effects, as discussed with reference to FIG. 2.

Figure 5B:
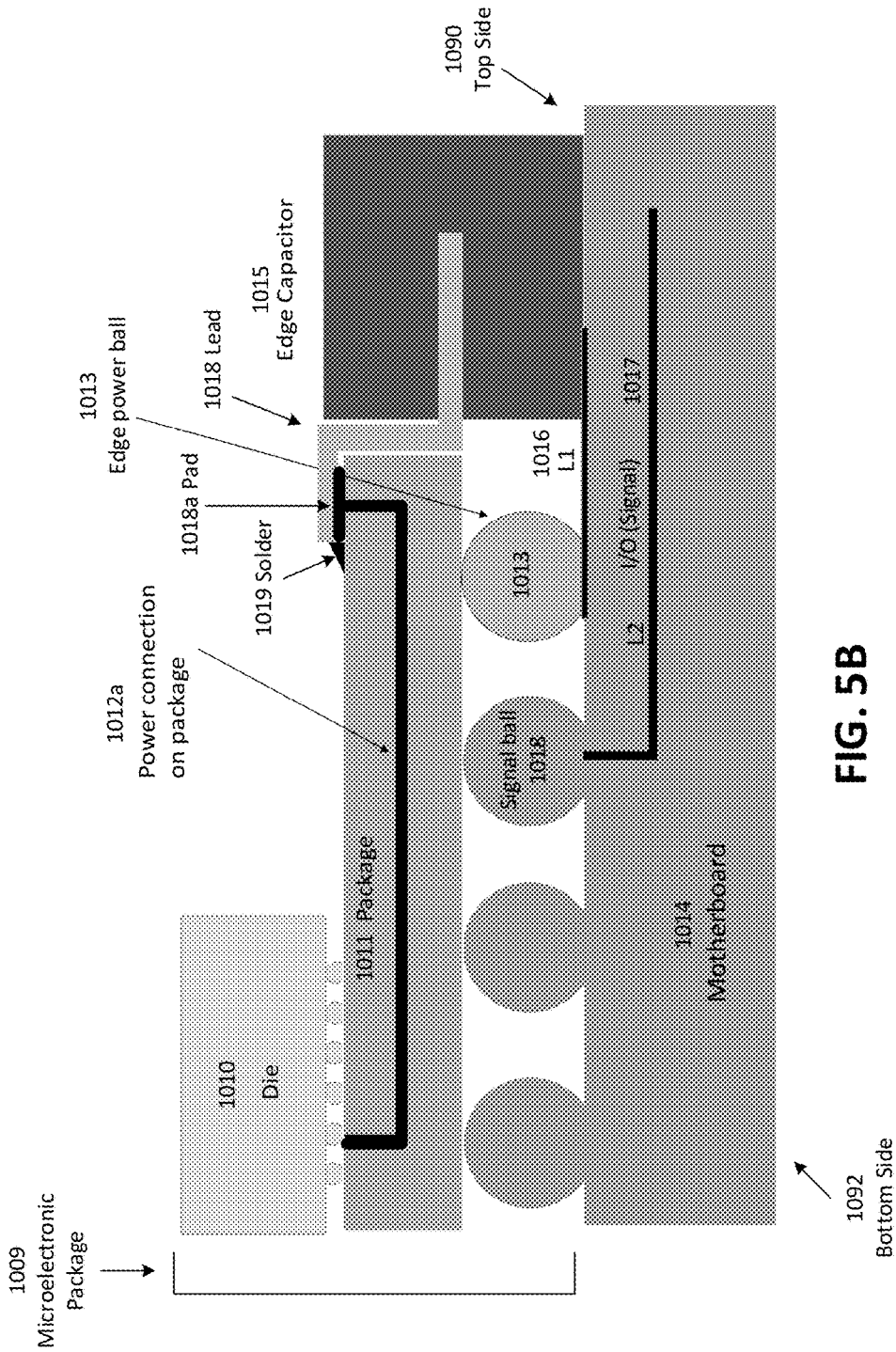
FIG. 5B illustrates an example configuration of a motherboard, to which an edge capacitor and a package are connected according to a second example embodiment.

FIG. 5B depicts a system 550 that illustrates another example placement of a surface-mounted decoupling capacitor on a single-sided motherboard. System 550 provides similar benefits as system 500. Rather than using a conductive interconnect element 502 as shown in system 500, however, system 550 utilizes a Z shaped hook up lead to provide interconnection between a decoupling capacitor and semiconductor package.

In one embodiment, an apparatus may comprise a decoupling capacitor on a logic board. As shown in FIG. 5B, for example, the system 550 may include an edge capacitor 1015 and a microelectronic package 1009 on a motherboard 1014. The motherboard 1014 may also comprise a hookup lead 1018. The hookup lead 1018 may connect the edge capacitor 1015 on the motherboard 1014 to a power conductor comprising a power pad 1018*a* of a package 1011 of the microelectronic package 1009.

In one embodiment, the hookup lead may comprise a Z-shape profile. As shown in FIG. 5B, the hookup lead 1018 may have a Z shaped geometry or profile. It may be appreciated, however, that the hookup lead 1018 may be configured using other shapes, geometries or profiles as desired for a given implementation. Further, a height for the hookup lead 1018 may vary based on a thickness for the package 1011. Embodiments are not limited in this context.

In one embodiment, the power pad is on a top surface of the semiconductor package. The hookup lead 1018 interconnects the edge capacitor 1015 to the power pad 1018*a* disposed on a top surface of the package 1011. A solder 1019 may secure attachment of the hookup lead 1018 to a surface of the package 1011.

In one embodiment, the semiconductor package may comprise a power connection to connect the power pad of the semiconductor package to a die of the semiconductor package. For example, the hookup lead 1018 may be implemented as a power conductor. The power pad 1018*a* may connect to an internal power plane 1012*a*. The internal power plan 1012*a* may connect to the die 1010 of the microelectronic package 1009.

Figure 5C:
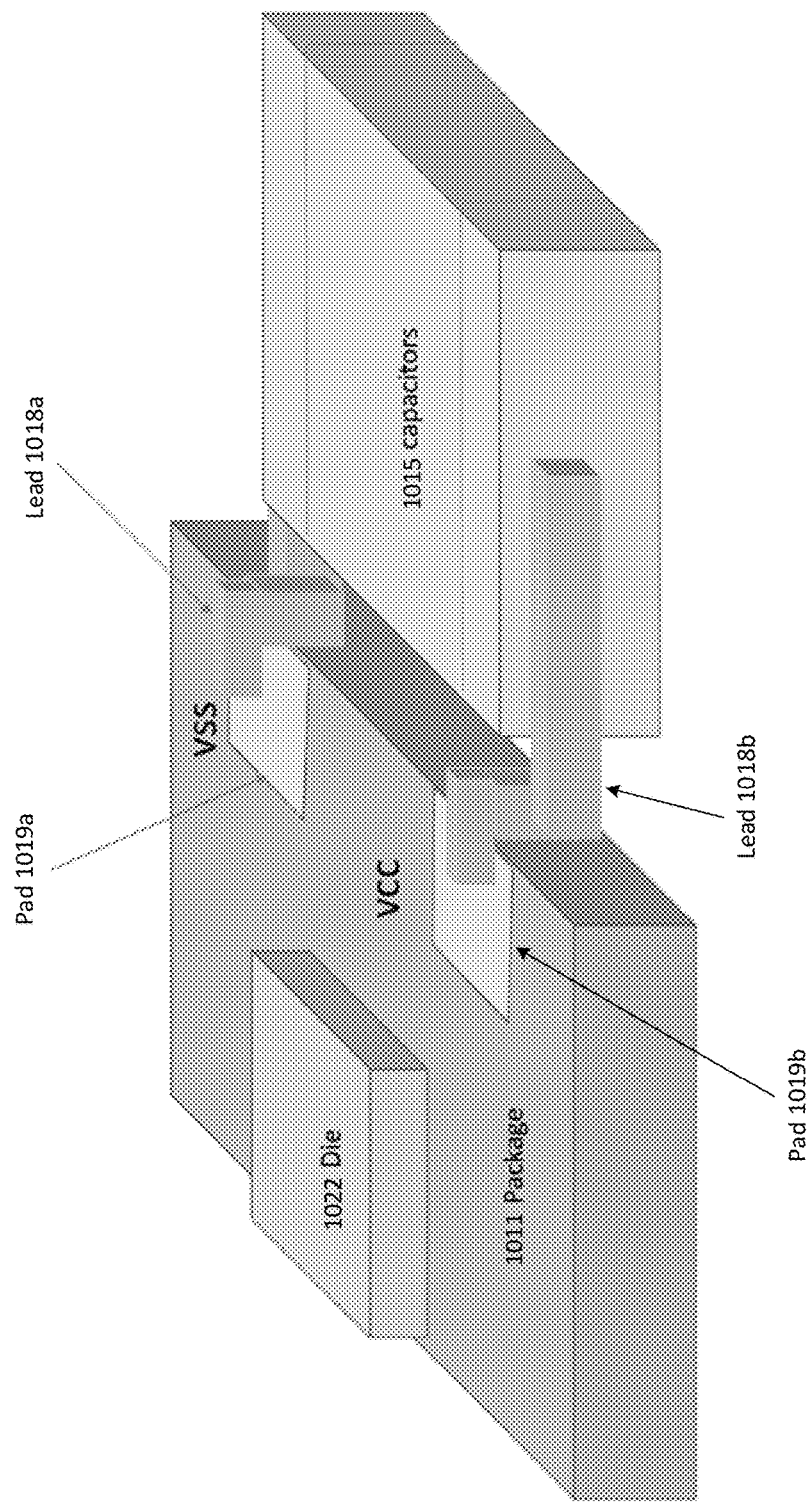
FIG. 5C illustrates an example configuration of a motherboard, to which an edge capacitor and a package are connected according to a third example embodiment.

FIG. 5C depicts a system 580 that illustrates a 3D view of how the Z profile hookup lead 1018 connects the package 1011 to the edge capacitor 1015. System 580 provides a pair of leads 1018*a*, 1018*b* connected at one end to one or more edge capacitors 1015. The leads 1018*a*, 1018*b* are connected at another end to the package 1011 via pads 1019*a*, 1019*b*, respectively. The pads 1019*a*, 1019*b* may be assigned as Vss and Vcc, respectively, of the package 1011. A die 1022 may be optionally disposed on top of the package 1011.

In one embodiments, the Z profile leads 1018*a*, 1018*b* can be placed next to the system on a chip (SOC) and/or central processing unit (CPU) on the motherboard 1014 where the leads 1018*a*, 1018*b* are to be soldered to the pads 1019*a*, 1019*b* during a surface-mount technology (SMT) process. The pads 1019*a*, 1019*b* may each have a layer of pre-solder to facilitate connection with the leads 1018*a*, 1018*b*, respectively. This avoids the need for adhesive or solder paste printing (e.g., on a CPU package) during the SMT process. Flux spray may be utilized to promote sufficient soldering between the pads 1019*a*, 1019*b* and the leads 1018*a*, 1018*b*, respectively.

The systems 500, 550 and 580 as depicted in FIGS. 5A, 5B, and 5C, respectively, provide a configuration that allows direct hook up of the edge capacitor 1015 to the internal power connection 1012 without any use of the motherboard 1014 (e.g., the surface layer of the motherboard 1014). Further, the configuration of system 550 allows a direct hook up of the edge capacitor 1015 to the internal power connection 1012 without any use of the edge solder balls. With this configuration, L2 breakout signals (on board) can breakout with a full or clean Vss referencing (on surface), thus avoiding or eliminating the split power referencing issue as described with reference to FIG. 2.

FIGS. 6A-D and 7A-7B illustrate various component layers for various example embodiments at various stages of manufacturing for systems 500 and/or 550. It may be appreciated that more or less component layers and manufacturing stages may be used for a given implementation. Embodiments are not limited in this context.

Figure 6A:
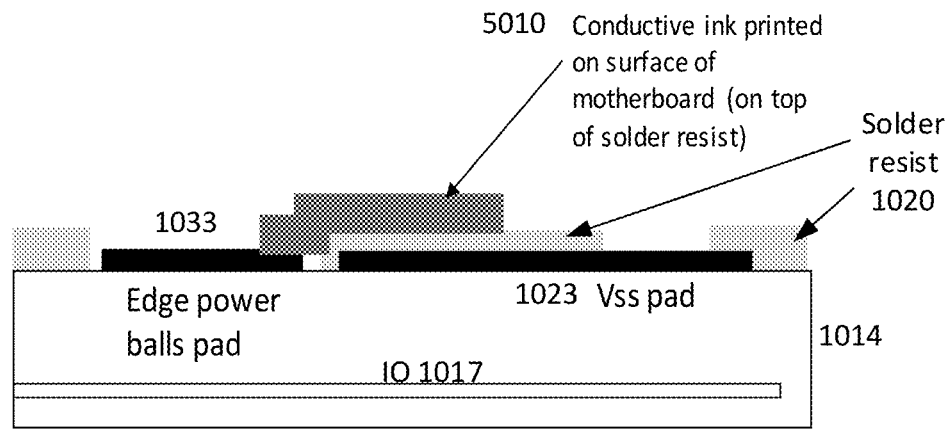
FIGS. 6A-6D illustrate various component layers of an example embodiment at various stages of producing an example embodiment.
Figure 6B:
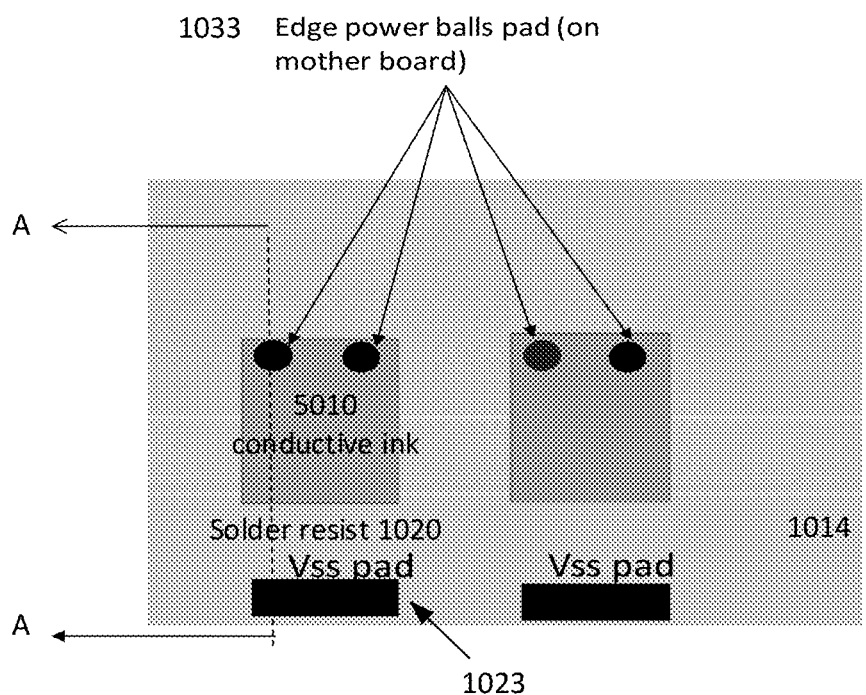

FIG. 6A depicts a cross-sectional view of a section taken along the line A-A shown in the top view of FIG. 6B. As illustrated in FIG. 6A, an electrically conductive adhesive may be applied on a surface of the motherboard 1014 to form a conductive interconnect element 5020. An electrically conductive adhesive is a glue used for electronics. The electric conductivity is caused by a component that makes approximately 80% of the total mass of an electrically conductive adhesive. This conductive component is suspended in a sticky component that holds the electrically conductive adhesive together. The particles of the conductive component are in contact with each other to facilitate passing of electric voltage and/or current. The conductive component can be made of elements such as silver, copper or graphite. Other conductive materials are possible as well. The sticky component can be a varnish (of one component) or a synthetic resin (of one or two components).

In one embodiment, for example, the electrically conductive adhesive may be implemented using conductive ink. The use of conductive ink may lower implementation costs relative to conventional copper plated pad/traces. Printing conductive pad/traces using an additive process also provides a technical advantage by reducing or eliminating waste streams, which need to be recovered and treated.

As shown in FIG. 6A, conductive ink 5010 may be applied (e.g., printed) on a surface of the motherboard 1014 to form a conductive interconnect element 5020. In one embodiment, for example, the conductive ink 5010 may be printed on top of the solder resist 1020. It may be appreciated that other conductive adhesives may be used to form a conductive interconnect element 5020, and embodiments are not limited to this example.

FIGS. 6A, 6B both illustrate that a portion of the conductive ink contacts the edge power balls pad 1033 provided on the motherboard 1014. In addition, as shown in FIGS. 6A and 6B, the solder resist 1020 is provided on top of a portion of the Vss lead 1023, such that the solder resist vertically separates the conductive ink 5020 and the Vss lead 1023.

Figure 6C:
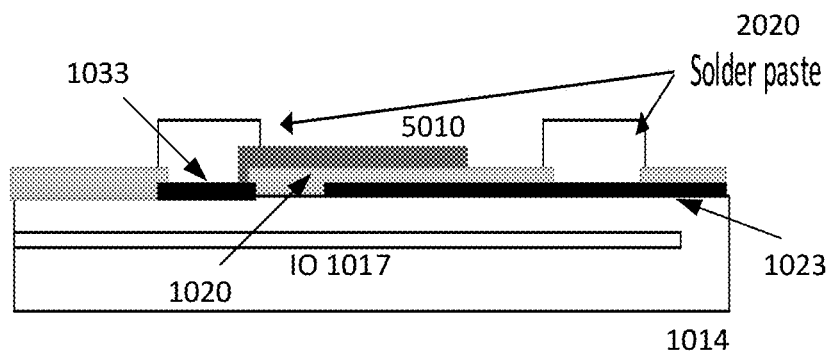

FIG. 6C depicts a manufacturing stage where solder paste 2020 may be applied (e.g., by printing) to an exposed portion of the Vss lead 1023 and an edge power ball pad 1033.

Figure 6D:
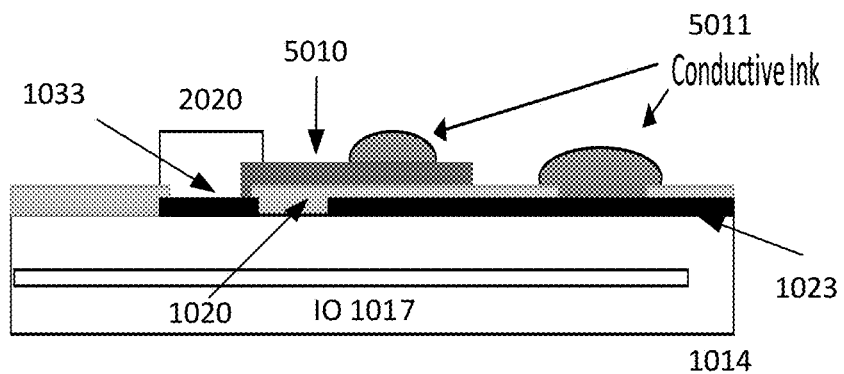

FIG. 6D depicts a manufacturing stage where conductive ink 5011 may be applied around solder paste 2020 and on a portion of previously-applied conductive ink 5010.

Figure 7A:
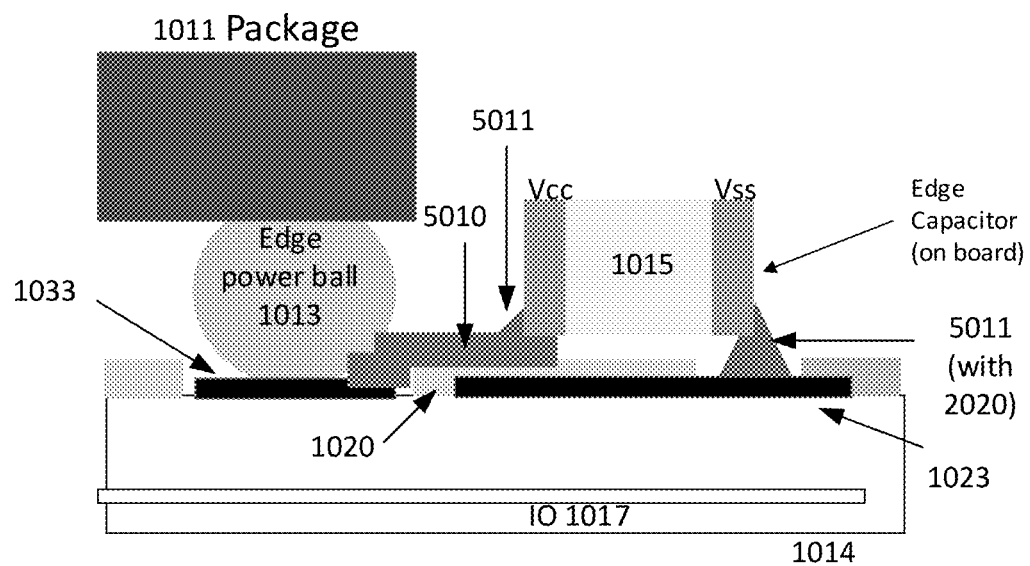
FIGS. 7A-7B illustrate various component layers of an example embodiment at various stages of producing an example embodiment.
Figure 7B:
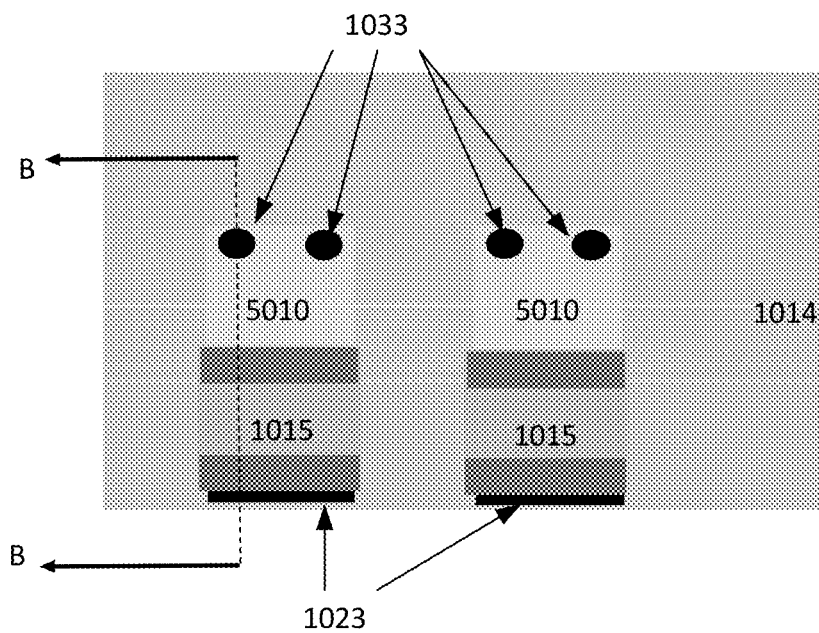

FIGS. 7A, 7B depict a final manufacturing stage. More particularly, FIG. 7A illustrates a cross-sectional view of a section taken along the line B-B as shown in the top view of FIG. 7B. The configuration shown in FIG. 7A may be achieved by (i) applying the edge capacitor 1015 to areas previously applied with the conductive ink 5011 and the solder paste 2020, as well as applying the edge power ball 1013 of the package 1011 to the conductive ink 5010 and the solder paste 2020 previously applied over the edge power balls pad 1033, followed by (ii) reflow soldering (which melts the solder) and curing. It should be noted that, for the sake of clarity, an outline of the package 1011 and the edge power ball 1013 are not explicitly depicted in FIG. 7B.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 8:
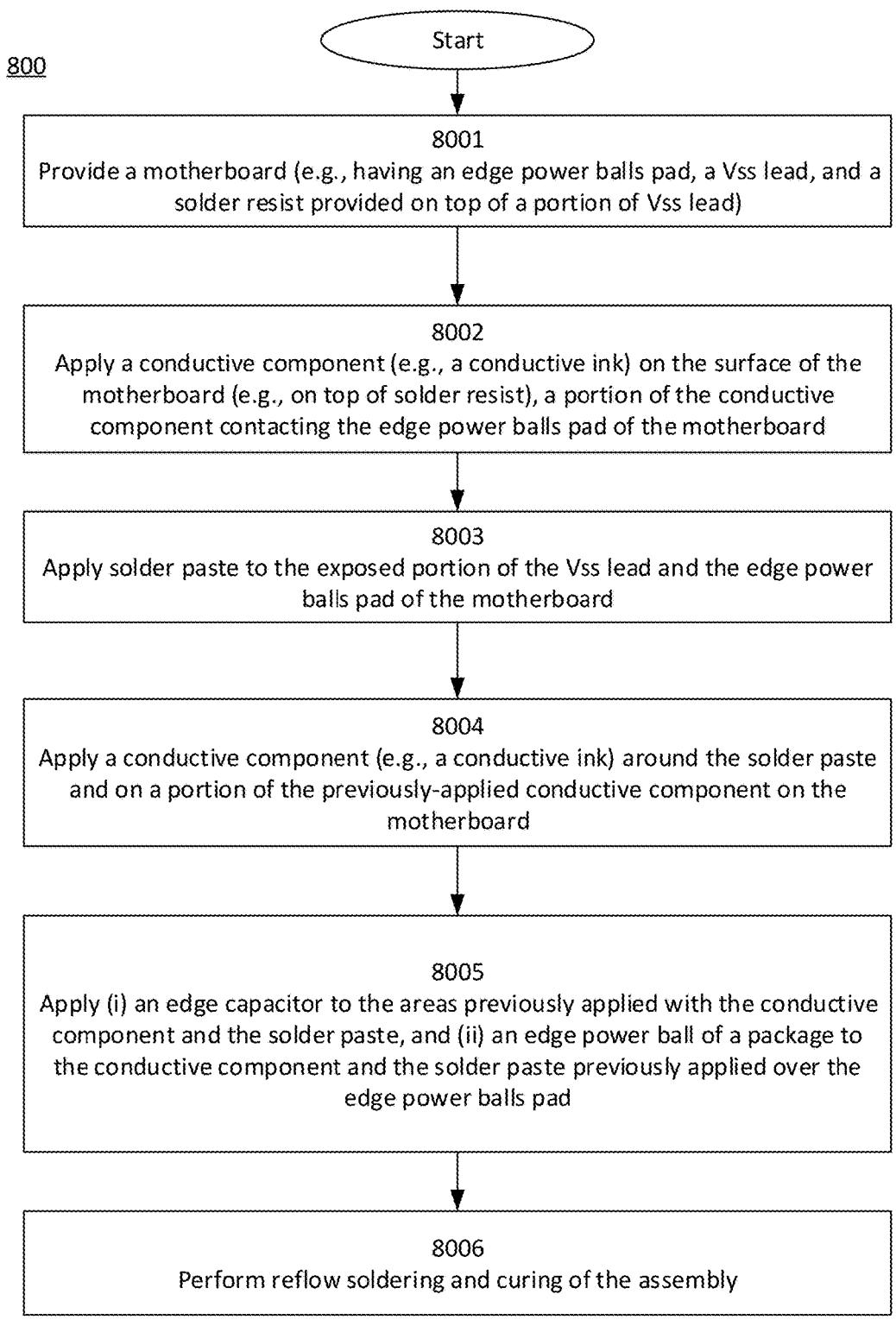
FIG. 8 illustrates a logic flow of a method for producing an example embodiment.

FIG. 8 illustrates one embodiment of a logic flow 800. The logic flow 800 may be representative of some or all of the operations executed by one or more embodiments described herein. More particularly, the logic flow 800 illustrates operations for producing an example embodiment as previously described with reference to FIGS. 1-7B.

The logic flow 800 may provide (or access) a motherboard at block 8001. For example, a motherboard 1014 as shown in FIG. 6A is provided. The motherboard 1014 may include various elements disposed on its surface, including an edge power balls pad 1013 (e.g., as shown in FIG. 6A), a Vss lead 1023 (e.g., as shown in FIG. 6A), and a solder resist 1020 (e.g., as shown in FIG. 6A). The solder resist 1020 may be provided on top of a portion of the Vss pad.

The logic flow 800 may apply a conductive component on the surface of the motherboard, a portion of the conductive component contacting the edge power balls pad of the motherboard at block 8002. For example, a conductive component 5010 made using a conductive ink 5010 (e.g., as shown in FIG. 6A) is applied (e.g., printed) on a surface of the motherboard 1014 on top of the solder resist 1020. A portion of the conductive ink 5010 may contact the edge power balls pad 1033 (e.g., as shown in FIG. 6A) provided on the motherboard 1014, and the solder resist 1020 may vertically separate the conductive ink 5010 and the Vss lead 1023. Although a conductive ink 5010 is provided as an example of the conductive component 5010, other materials may be utilized as the conductive component, and examples are not limited in this context.

The logic flow 800 may apply solder paste to the exposed portion of the Vss lead and the edge power balls pad of the motherboard at block 8003. For instance, a solder paste 2020 (e.g., as shown in FIG. 6C) may be applied (e.g., by printing) to the exposed portion of the Vss lead 1023 (e.g., as shown in FIG. 6C) and the edge power balls pad 1033 (e.g., as shown in FIG. 6C).

The logic flow 800 may apply a conductive component around the solder paste and on a portion of the previously-applied conductive component on the motherboard at block 8004. For example, a conductive component 5010 made from a conductive ink 5011 (e.g., as shown in FIG. 6D) may be applied around the solder paste 2020 and on a portion of previously-applied conductive ink 5010 (e.g., as shown in FIG. 6D).

The logic flow 800 may apply (i) an edge capacitor to the areas previously applied with the conductive component and the solder paste, and (ii) an edge power ball of a package to the conductive component and the solder paste previously applied over the edge power balls pad, at block 8005. For instance, the edge capacitor 1015 (e.g., as shown in FIG. 7A) is applied to the areas previously applied with conductive ink 5011 and the solder paste 2020, and the edge power ball 1013 (e.g., as shown in FIG. 7A) of the package 1011 (e.g., as shown in FIG. 7A) is applied to the conductive ink 5010 and the solder paste 2020 previously applied over the edge power balls pad 1033.

The logic flow 800 may perform reflow soldering and curing of the assembly at block 8006. For example, reflow soldering may melt the solder and curing of the assembly is performed to achieve a configuration as shown in FIG. 7A (which depicts a cross-sectional view of a section taken along the line B-B shown in the top view of FIG. 7B). The configuration shown in FIG. 7A corresponds to the configuration shown in FIG. 5.

Figure 9:
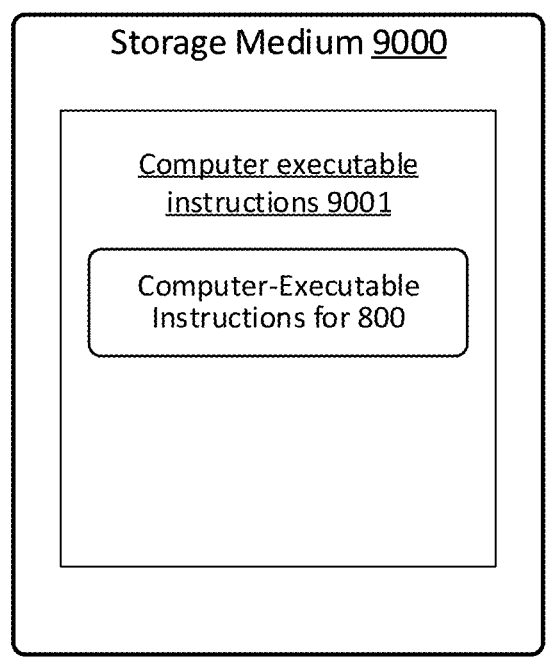
FIG. 9 illustrates a computer-readable storage medium according to an embodiment.

FIG. 9 illustrates an embodiment of a storage medium 9000. The storage medium 9000 may comprise an article of manufacture. In some examples, the storage medium 9000 may include any non-transitory computer readable medium or machine readable medium, such as an optical, magnetic or semiconductor storage. The storage medium 9000 may store various types of computer executable instructions e.g., 9001). For example, the storage medium 9000 may store various types of computer executable instructions to implement the technique 800. For example, the storage medium 9000 may store various types of computer executable instructions to implement the technique 800, which instructions can be executed by a specially programmed computer system operably coupled to manufacturing tools to carry out the manufacturing techniques described herein.

Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
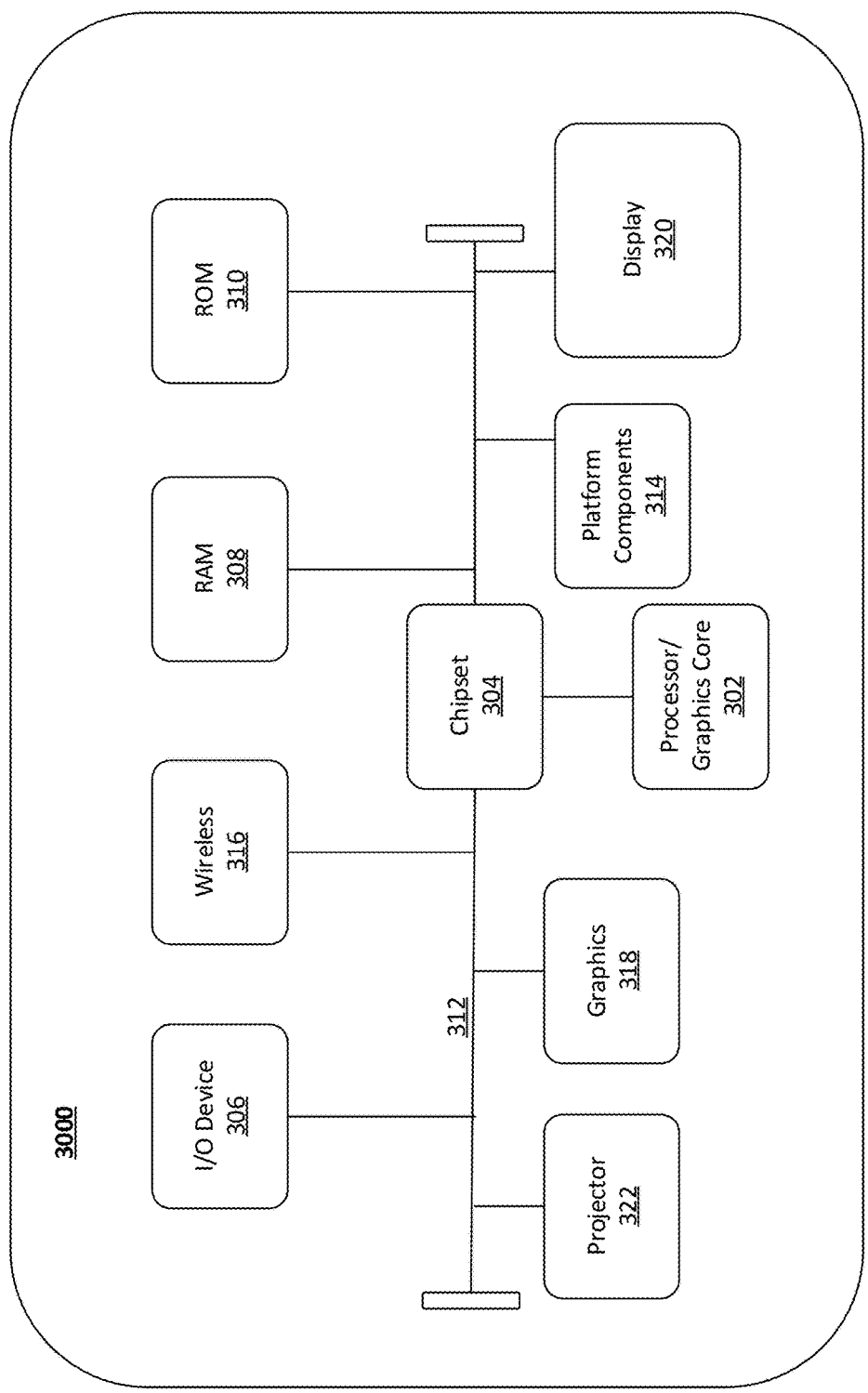
FIG. 10 illustrates a system according to an embodiment.

FIG. 10 is a diagram of an exemplary system embodiment and in particular, depicts a platform 3000, which may include various elements. For instance, this figure depicts that platform (system) 3000 may include a processor/graphics core 302, a chipset 304, an input/output (I/O) device 306, a random access memory (RAM) (such as dynamic RAM (DRAM)) 308, and a read only memory (ROM) 310, display electronics 320, projector 322, and various other platform components 314 (e.g., a fan, a cross flow blower, a heat sink, DTM system, cooling system, housing, vents, and so forth). System 3000 may also include wireless communications chip 316 and graphics device 318. The embodiments, however, are not limited to these elements.

As depicted, I/O device 306, RAM 308, and ROM 310 are coupled to processor 302 by way of chipset 304. Chipset 304 may be coupled to processor 302 by a bus 312. Accordingly, bus 312 may include multiple lines.

Processor 302 may be a central processing unit comprising one or more processor cores and may include any number of processors having any number of processor cores. The processor 302 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 302 may be multiple separate processors located on separate integrated circuit chips. In some embodiments processor 302 may be a processor having integrated graphics, while in other embodiments processor 302 may be a graphics core or cores.

The following examples pertain to further embodiments:

Example 1 comprises an apparatus for a logic board system, comprising a decoupling capacitor on a logic board; and a conductive interconnect element on the logic board, the conductive interconnect element to connect the decoupling capacitor on the logic board to a power conductor comprising a power pad of a semiconductor package, the conductive interconnect element at a different layer than a ground-potential layer of the logic board.

Example 2 comprises example 1, wherein the conductive interconnect element is a conductive ink.

Example 3 comprises example 1, wherein the conductive interconnect element is a power conductor.

Example 4 comprises example 1, further comprising a solder resist layer on the logic board, wherein the conductive interconnect element is above the solder resist layer on the logic board.

Example 5 comprises example 1, wherein the ground-potential layer is below a solder resist layer on the logic board, and wherein the conductive interconnect element is a power layer.

Example 6 comprises example 1, wherein the conductive interconnect element connects to a power ball pad on the logic board.

Example 7 comprises example 1, further comprising a signal layer on the logic board that is below the ground-potential layer and references the ground-potential layer.

Example 8 comprises example 1, further comprising a signal layer on the logic board that is below the ground-potential layer, and solely references the ground-potential layer.

Example 9 comprises a logic board system, comprising a printed circuit board (PCB); and a conductive interconnect element on the PCB, the conductive interconnect element to connect an edge capacitor to a power conductor comprising a power ball of a ball grid array (BGA) package, the conductive interconnect element at a different layer than a ground-potential layer of the PCB.

Example 10 comprises example 9, wherein the conductive interconnect element is a conductive ink.

Example 11 comprises example 9, wherein the conductive interconnect element is a power conductor.

Example 12 comprises example 9, wherein the conductive interconnect element is above a solder resist layer on the PCB.

Example 13 comprises example 9, wherein the ground-potential layer is below a solder resist layer on the PCB, and the conductive interconnect element defines a power layer.

Example 14 comprises example 9, wherein the conductive interconnect element connects to a power ball pad provided on the PCB.

Example 15 comprises example 13, wherein the solder resist layer separates the power layer from the ground-potential layer, and a signal layer of the PCB below the ground-potential layer references the ground-potential layer.

Example 16 comprises example 15, wherein the signal layer of the PCB solely references the ground-potential layer.

Example 17 comprises a method to form a logic board system, the method comprising forming a conductive interconnect element above a solder resist layer on a printed circuit board (PCB); and connecting the conductive interconnect element to a decoupling capacitor positioned on the PCB and a power conductor comprising a power ball of a ball grid array (BGA) package.

Example 18 comprises example 17, wherein the conductive interconnect element is formed by a conductive ink.

Example 19 comprises example 17, further comprising printing a conductive ink on the solder resist layer; and curing the conductive ink to form the conductive interconnect element.

Example 20 comprises example 17, further comprising connecting the conductive interconnect element to a power ball pad provided on the PCB.

Example 21 comprises example 17, further comprising connecting the power ball to the power ball pad.

Example 22 comprises example 18, wherein a ground-potential layer is below the solder resist layer on the PCB, and the conductive interconnect element defines a power layer.

Example 23 comprises example 22, further comprising connecting the conductive interconnect element to a power ball pad on the PCB.

Example 24 comprises example 22, wherein the solder resist layer separates the power layer from the ground-potential layer, and a signal layer below the ground-potential layer references the ground-potential layer.

Example 25 comprises example 24, wherein the signal layer solely references the ground-potential layer.

Example 26 comprises example 17, further comprising applying a solder to at least portion of the conductive interconnect element; and connecting the conductive interconnect element to the decoupling capacitor using the solder.

Example 27 comprises example 20, further comprising applying a solder to at least a portion of the power ball pad; and connecting the conductive interconnect element to the at least one power ball using the solder applied to the power ball pad.

Example 28 comprises example 17, further comprising applying a solder to at least portion of the conductive interconnect element; and connecting the conductive interconnect element to the decoupling capacitor using the solder.

Example 29 comprises example 17, further comprising applying a solder to at least a portion of the power ball pad; and connecting the conductive interconnect element to the at least one power ball using the solder applied to the power ball pad.

Example 30 comprises an apparatus for a logic board system, comprising a decoupling means on a printed circuit board (PCB); and a conductive interconnect means on the PCB, the conductive interconnect means for connecting the decoupling means to at least one power conductor configured as at least one power ball of a ball grid array (BGA) package, the conductive interconnect means provided at a different vertical level than a ground-potential layer of the PCB.

Example 31 comprises example 30, wherein the conductive interconnect means is a conductive ink.

Example 32 comprises example 30, wherein the conductive interconnect means is a power conductor and the decoupling means is a decoupling capacitor.

Example 33 comprises example 32, wherein the conductive interconnect means is on top of a solder resist layer provided on the PCB.

Example 34 comprises example 33, wherein the ground-potential layer is below the solder resist layer on the PCB, and wherein the conductive interconnect means defines a power layer.

Example 35 comprises example 34, wherein the conductive interconnect means is connected to a power ball pad on the PCB.

Example 36 comprises example 34, wherein the solder resist layer separates the power layer from the ground-potential layer, and wherein a signal layer of the PCB below the ground-potential layer references the ground-potential layer.

Example 37 comprises example 36, wherein the signal layer of the PCB below the ground-potential layer solely references the ground-potential layer.

Example 38 comprises a logic board system, comprising a printed circuit board (PCB); and a conductive interconnect means on the PCB, the conductive interconnect means to connect a decoupling means on the PCB to at least one power conductor configured as at least one power ball of a ball grid array (BGA) package, the conductive interconnect means at a different vertical level than a ground-potential layer of the PCB.

Example 39 comprises example 38, wherein the conductive interconnect means is a conductive ink.

Example 40 comprises example 38, wherein the conductive interconnect means is a power conductor and the decoupling means is a decoupling capacitor.

Example 41 comprises example 40, wherein the conductive interconnect means is on top of a solder resist layer on the PCB.

Example 42 comprises example 41, wherein the ground-potential layer is below the solder resist layer provided on the PCB, and wherein the conductive interconnect means defines a power layer.

Example 43 comprises example 42, wherein the conductive interconnect means is connected to a power ball pad on the PCB.

Example 44 comprises example 42, wherein the solder resist layer separates the power layer from the ground-potential layer, and wherein a signal layer of the PCB provided below the ground-potential layer references the ground-potential layer.

Example 45 comprises example 44, wherein the signal layer of the PCB below the ground-potential layer solely references the ground-potential layer.

Example 46 comprises an apparatus for a logic board system, comprising a decoupling capacitor on a logic board; and a hookup lead on the logic board, the hookup lead to connect the decoupling capacitor on the logic board to a power conductor comprising a power pad of a semiconductor package, the hookup lead to comprise a Z-shape profile.

Example 47 comprises example 46, wherein the hookup lead is a power conductor.

Example 48 comprises example 46, wherein the power pad is on a top surface of the semiconductor package.

Example 49 comprises example 46, the semiconductor package comprising an internal power plane to connect the power pad of the semiconductor package to a die of the semiconductor package.

Example 50 comprises a non-transitory, computer-readable medium storing instructions which, when executed on a computing device, cause the computing device to carry out a method according to any one of examples 17-29.

Numerous specific details have been set forth herein to provide a thorough understanding of the embodiments. It will be understood by those skilled in the art, however, that the embodiments may be practiced without these specific details. In other instances, well-known operations, components, and structures have not been described in detail so as not to obscure the embodiments. It can be appreciated that the specific structural and functional details disclosed herein may be representative and do not necessarily limit the scope of the embodiments.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

As used herein, the terms "over", "to", "between" and "on" may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Further, the terms "attached" and "coupled" may mean directly adjacent to or in direct contact with another element or may mean in a close physical relationship with another element without being directly adjacent to or in direct contact with the other element.

The microelectronics packages and/or layers described herein along with the techniques described herein can be implemented in or can be part of any processor within any computing device. The term "processor" may refer to any device or portion of a device that processes electronic data from registers and/or memory to transform that electronic data into other electronic data that may be stored in registers and/or memory. In various embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further embodiments, the computing device may be any other electronic device that processes data.

Further, embodiments herein may describe layers as positioned under or on top of another layer but are not so limited. Such descriptions may be relative to a particular orientation of the described layers as shown in one or more figures provided herein. Accordingly, descriptions relating to a layer on top of or below another layer may also be described as being on a first (e.g., lateral) side or a second opposite side of another layer.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a decoupling capacitor on a logic board;
   a solder resist layer on the logic board; and
   a conductive interconnect element disposed above the solder resist layer on the logic board, the conductive interconnect element to connect the decoupling capacitor on the logic board to a power conductor comprising a power pad of a semiconductor package, the conductive interconnect element at a different layer than a ground-potential layer of the logic board.

2. The apparatus of claim 1, wherein the conductive interconnect element is a conductive ink.

3. The apparatus of claim 1, wherein the conductive interconnect element is a power conductor.

4. The apparatus of claim 1, wherein the ground-potential layer is below a solder resist layer on the logic board, and wherein the conductive interconnect element is a power layer.

5. The apparatus of claim 1, wherein the conductive interconnect element connects to a power ball pad on the logic board.

6. The apparatus of claim 1, comprising a signal layer on the logic board that is below the ground-potential layer and references the ground-potential layer.

7. The apparatus of claim 1, comprising a signal layer on the logic board that is below the ground-potential layer, and solely references the ground-potential layer.

8. A system, comprising:
   a printed circuit board (PCB);
   a solder resist layer on the PCB; and
   a conductive interconnect element disposed above the solder resist layer on the PCB, the conductive interconnect element to connect an edge capacitor to a power conductor comprising a power ball of a ball grid array (BGA) package, the conductive interconnect element at a different layer than a ground-potential layer of the PCB.

9. The system of claim 8, wherein the conductive interconnect element is a conductive ink.

10. The system of claim 8, wherein the conductive interconnect element is a power conductor.

11. The system of claim 8, wherein the ground-potential layer is below a solder resist layer on the PCB, and the conductive interconnect element defines a power layer.

12. The system of claim 8, wherein the conductive interconnect element connects to a power ball pad provided on the PCB.

13. The system of claim 11, wherein the solder resist layer separates the power layer from the ground-potential layer, and a signal layer of the PCB below the ground-potential layer references the ground-potential layer.

14. The system of claim 13, wherein the signal layer of the PCB solely references the ground-potential layer.

\* \* \* \* \*